US007285497B2

(12) United States Patent
Yotsuya

(10) Patent No.: US 7,285,497 B2

(45) Date of Patent: Oct. 23, 2007

(54) MASK, METHOD FOR MANUFACTURING A MASK, METHOD FOR MANUFACTURING AN ELECTRO-OPTICAL DEVICE, AND ELECTRONIC EQUIPMENT

(75) Inventor: Shinichi Yotsuya, Nagano (JP)

(73) Assignee: Seiko Epson Corporation (JP)

( * ) Notice: Subject to any disclaimer, the term of this patent is extended or adjusted under 35 U.S.C. 154(b) by 120 days.

(21) Appl. No.: 11/093,840

(22) Filed: Mar. 30, 2005

(65) Prior Publication Data

US 2005/0221609 A1 Oct. 6, 2005

(30) Foreign Application Priority Data

Mar. 31, 2004 (JP) ............................. 2004-104311

(51) Int. Cl.
*H01L 21/311* (2006.01)

(52) U.S. Cl. ...................... 438/700; 438/637; 438/522; 257/E21.231; 257/E21.058; 257/E21.218; 257/E21.227; 257/E21.245

(58) Field of Classification Search ................ 438/522, 438/29, 30, 70, 524, 533, 555, 556, 723, 438/724, 756, 757, 637, 270, 700, 733, 706, 438/736, 738

See application file for complete search history.

(56) References Cited

U.S. PATENT DOCUMENTS

| | | | | |
|---|---|---|---|---|
| 5,067,985 | A * | 11/1991 | Carver et al. | 136/255 |
| 5,801,083 | A * | 9/1998 | Yu et al. | 438/424 |
| 6,001,707 | A * | 12/1999 | Lin et al. | 438/433 |
| 6,165,906 | A * | 12/2000 | Bandyopadhyay et al. | 438/700 |
| 6,426,271 | B2 * | 7/2002 | Chen et al. | 438/435 |
| 6,511,902 | B1 * | 1/2003 | Liang et al. | 438/620 |
| 6,524,929 | B1 * | 2/2003 | Xiang et al. | 438/424 |
| 6,528,780 | B1 * | 3/2003 | Mitsuoka et al. | 250/216 |
| 6,670,279 | B1 * | 12/2003 | Pai et al. | 438/719 |
| 6,724,718 | B1 * | 4/2004 | Shinohara et al. | 369/300 |
| 6,787,874 | B2 * | 9/2004 | Ootera | 257/499 |
| 6,828,209 | B1 * | 12/2004 | Maruo | 438/424 |
| 6,881,947 | B2 * | 4/2005 | Mitsuoka et al. | 250/216 |

FOREIGN PATENT DOCUMENTS

| | | |
|---|---|---|
| JP | 62-297457 | 12/1987 |
| JP | 04-236758 | 8/1992 |
| JP | 10-298738 | 11/1998 |
| JP | 2001-185350 | 7/2001 |
| JP | 2001-273976 | 10/2001 |
| JP | 2002-313564 | 10/2002 |
| JP | 2003-045657 | 2/2003 |
| JP | 2003-100452 | 4/2003 |
| JP | 2004-006371 | 1/2004 |
| JP | 2004-043877 | 2/2004 |
| JP | 2005-015908 | 1/2005 |

* cited by examiner

*Primary Examiner*—David Nhu
(74) *Attorney, Agent, or Firm*—Harness, Dickey & Pierce, P.L.C.

(57) ABSTRACT

A mask includes a silicon member, and a portion defining an opening penetrating the silicon member; and the corner of the opening is rounded.

10 Claims, 11 Drawing Sheets

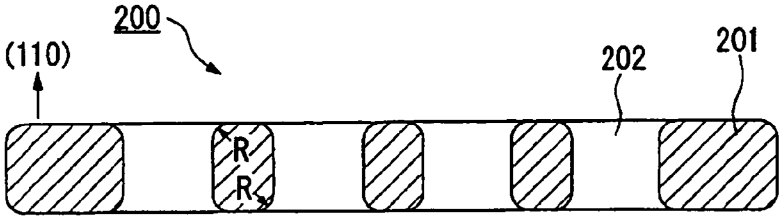
FIG. 3
| R[μm] | 0.01 | 0.05 | 0.1 | 0.5 | 1.0 | 2.0 | 3.0 | 5.0 | 8.0 | 10.0 |
|---|---|---|---|---|---|---|---|---|---|---|
| ENDURANCE TIMES | 1 | 5 | 10 | 100 | NO DAMAGE | NO DAMAGE | NO DAMAGE | NO DAMAGE | NO DAMAGE | NO DAMAGE |
FIG. 4
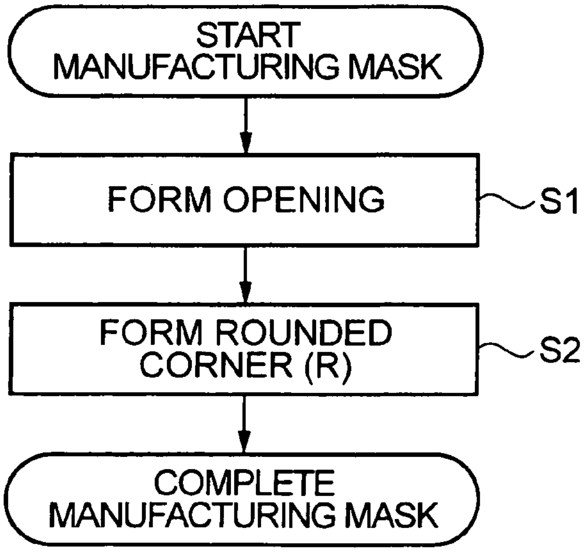
FIG. 5

| CONFIGURATION | PIXEL LAYOUT | TFT WIRING COST | IMAGE QUALITY | CHARACTER QUALITY | NOTES |
|---|---|---|---|---|---|
| VERTICAL STRIPE |   | SIMPLE (LOW) | ○ | ○ | OFTEN USED FOR LCD AND PDP. EASY WIRING. HIGH IMAGE AND CHARACTER QUALITY. |
| DELTA |  | COMPLICATED (HIGH) | ○ | △ | OFTEN USED FOR LARGE ORGANIC EL PANELS. EASY MASK FORMING. |
| SQUARE |  | COMPLICATED (RELATIVELY HIGH) | ○ | ○ | OFTEN USED FOR CCD, BUT NOT FOR DISPLAYS. |

MASK, METHOD FOR MANUFACTURING A MASK, METHOD FOR MANUFACTURING AN ELECTRO-OPTICAL DEVICE, AND ELECTRONIC EQUIPMENT

RELATED APPLICATIONS

This application claims priority to Japanese Patent Application No. 2004-104311 filed Mar. 31, 2004 which is hereby expressly incorporated by reference herein in its entirety.

BACKGROUND

1. Technical Field

The present invention relates to a mask, a method for manufacturing a mask, a method for manufacturing an electro-optical device, and electronic equipment.

2. Related Art

An organic electroluminescent (EL) panel, which is a kind of electro-optical device, is made up of light-emitting, fast-response display elements having a multilayered structure of thin films. The organic EL panel forms a lightweight display that provides high-speed motion picture response, and thus has recently drawn great attention as the display panel of a flat panel display (FPD) TV, for example. A typical method for manufacturing such an organic EL panel is described in *Applied Physics Letters,* Vol. 51, No. 12: 913-14, 1987. Specifically, a transparent anode made of indium tin oxide (ITO), for instance, is patterned by photolithography in a desired pattern. Then, an organic material is deposited on the pattern with a vacuum evaporator. On top of that, a cathode film of a low work function metal, such as MgAg, is evaporated to form a cathode.

Light-emitting elements arranged this way are finally sealed in an inert gas atmosphere so as not to come in contact with moisture or oxygen.

The organic EL panel can emit light of various colors by changing light-emitting materials. For example, a technique for forming red, green, and blue light-emitting elements for individual pixels with a thin, highly fine metal mask has been proposed. This technique is to make a metal mask and glass substrate stick together with a magnet and perform evaporation through the mask in order to manufacture a full-color organic EL panel that provides sharp images (see Japanese Unexamined Patent Publication No. 2001-273976, for example).

To perform evaporation with a mask, a technique for manufacturing an evaporation mask using a silicon substrate has been developed. This method employs semiconductor manufacturing techniques, such as photolithography and dry etching, and develops the silicon substrate into a mask.

Since the thermal expansion coefficient of silicon is almost equal to that of glass, no displacement occurs between the silicon mask and a glass substrate on which a film is deposited due to thermal expansion. In addition, using silicon can enhance processing accuracy (see Japanese Unexamined Patent Publication No. 2001-185350, for example).

The metal mask described in Japanese Unexamined Patent Publication No. 2001-273976 has the following problem. To increase the panel size for a larger organic EL panel, it is necessary to make the metal mask used for the panel correspondingly larger. It is, however, difficult to manufacture a large and thin metal mask with a high degree of accuracy. Furthermore, the thermal expansion coefficient of the metal mask is much larger than that of the glass substrate used for the organic EL panel. Therefore, the metal mask expands much more than the glass substrate because of thermal radiation during evaporation. As a result, variations due to the thermal expansion accumulate and become considerable when manufacturing a large organic EL panel with the metal mask. It is therefore considered that the metal mask can be used for manufacturing small- or middle-sized panels of about 20 inches at most.

The evaporation mask using the silicon substrate described in Japanese Unexamined Patent Publication No. 2001-185350 has an opening with a predetermined pattern formed by crystal anisotropic etching. The corners of the opening are almost right-angled or sharp-angled. The problem is that stress tends to be concentrated in the corners of the evaporation mask described in Japanese Unexamined Patent Publication No. 2001-185350, and the mask is easily broken once a force is applied to it. Therefore, it is impractical to use the evaporation mask using the silicon substrate described in Japanese Unexamined Patent Publication No. 2001-185350 in equipment manufacturing sites.

In consideration of the above-described problems, the present invention aims to provide a silicon mask with high mechanical strength that is hard to break; a method for manufacturing such a mask; a method for manufacturing an electro-optical device; and electronic equipment.

The present invention also aims to provide a mask that is applicable to a larger area in which a film is deposited and capable of patterning a thin film with a high degree of accuracy, and whose corners are resistant to breakage (are hard to break) and endure repetitive use; a method for manufacturing such a mask; a method for manufacturing an electro-optical device; and electronic equipment.

SUMMARY

In order to address the above-mentioned problems, a mask according to an aspect of the present invention includes a silicon part, and a portion defining an opening penetrating the silicon part, and the corner of the opening is rounded (the rounded corner R).

According to this aspect of the present invention, since the mask includes a silicon part, the thermal expansion coefficient of the mask is equal or close to that of a member on which a film is deposited, that is, a glass substrate, for example. Therefore, dimensional variations in a film pattern caused by a thermal expansion difference can be reduced. According to this aspect of the present invention, since the mask includes a silicon part, the accuracy of processing the opening can be easily increased.

The corners of at least the opening in the mask including a silicon part are rounded according to this aspect of the present invention. In other words, sharp- or right-angle interfaces are removed. Thus, this aspect of the present invention reduces stress concentration in the corners and provides a mask having high mechanical strength. Therefore, this aspect of the present invention can easily provide a mask for forming a thin film pattern with a high degree of accuracy and whose corners are hard to break and endure repetitive use. The mask can be economically mass produced.

The mask according to this aspect of the present invention is preferably disposed between a member on which a film is deposited and an evaporation source from which a material is emitted for patterning a thin film on the member, and the opening is a through-hole in the mask through which the material passes for the patterning.

With this structure, it is possible to provide a mask that forms an evaporated pattern with a high degree of dimensional accuracy and has high mechanical strength, for example. Also with this structure, it is possible to provide a mask that forms a thin film pattern with a high degree of dimensional accuracy by sputtering or chemical vapor deposition (CVD), for example, and has high mechanical strength.

In the mask according to this aspect of the present invention, the radius of the corner that is rounded is preferably from 0.5 μm to 3.0 μm inclusive.

With this structure, it is possible to provide a mask that forms a thin film pattern with a high degree of dimensional accuracy and has high mechanical strength. It was experimentally found that the stress concentration in a rounded corner cannot be sufficiently reduced when the radius of the rounded corner is smaller than 0.5 μm. Meanwhile, it becomes difficult to form a thin film pattern with sufficient dimensional accuracy as the radius of the rounded corner is larger than 3.0 μm. With this structure, it is possible to both provide a mask that forms a thin film pattern with a high degree of dimensional accuracy and has high mechanical strength.

In the mask according to this aspect of the present invention, the cross section and planar shapes of the opening have the corner that is rounded.

With this structure, the concentration of stress that can be applied to the mask including a silicon part from any direction can be reduced, and the mechanical strength of the mask including a silicon part can be further increased.

In order to address the above-mentioned problems, a method for manufacturing a mask according to another aspect of the present invention includes forming an opening penetrating a silicon substrate included in the mask, and rounding a corner of the opening (the rounded corner R).

According to this aspect of the present invention, since the corners of at least the opening in the silicon substrate included in the mask are rounded to be rounded corners R, the concentration of stress in the corners can be reduced.

Therefore, this aspect of the present invention can easily provide a mask for forming a thin film pattern with a high degree of accuracy and whose corners are hard to break and endure repetitive use.

In the method for manufacturing a mask according to this aspect of the present invention, rounding a corner is preferably done by performing isotropic etching to the silicon substrate.

With this method, when sharp- or right-angles are developed at the opening etc. of the silicon substrate in forming the opening, it is possible to easily round the corners with a desirable radius by isotropic etching. Here, isotropic etching means etching in all directions of an etched substance at a fixed rate unlike anisotropic etching whose etching rate in a specific direction is fast or slow. With this method, it is possible to easily manufacture a mask that forms a thin film pattern with a high degree of dimensional accuracy and has high mechanical strength.

In the method for manufacturing a mask according to this aspect of the present invention, the isotropic etching is preferably performed by using a substance containing a first material for oxidizing a silicon crystal and a second material for removing a portion oxidized by the first material from the silicon crystal.

With this method, it is possible to easily perform isotropic etching by immersing the silicon substrate in which the opening has been formed in an etchant containing the first and second materials. More specifically, the corners in the immersed silicon substrate are oxidized by the first material and then the oxidized portion is removed by the second material.

In the method for manufacturing a mask according to this aspect of the present invention, the isotropic etching is preferably performed by using an etchant containing nitric acid and hydrofluoric acid.

With this method, the corners in the silicon substrate are oxidized by nitric acid and then the oxidized portion is removed by hydrofluoric acid. Therefore, the corners in the silicon substrate (the opening or the whole part of the silicon substrate) included in the mask can be easily rounded.

In the method for manufacturing a mask according to this aspect of the present invention, the isotropic etching is preferably performed by using an etchant containing nitric acid, hydrofluoric acid, and acetic acid.

With this method, the corners in the silicon substrate are oxidized by nitric acid and then the oxidized portion is removed by hydrofluoric acid. Furthermore, a rough exposed surface of the silicon substrate is polished by acetic acid with this method. Therefore, this method can easily provide a mask that is closely adhered to a member on which a film is deposited, used for forming a thin film pattern with a high degree of accuracy, and equipped with high mechanical strength.

In the method for manufacturing a mask according to this aspect of the present invention, the isotropic etching is preferably performed by dry etching.

With this method, the corners in the silicon substrate included in the mask can be easily rounded by dry etching.

In the method for manufacturing a mask according to this aspect of the present invention, the dry etching is preferably performed by using any of an SF6, CF, and chlorinated gas.

With this method, the corners in the silicon substrate can be rounded by molecules of an SF6, CF, or chlorinated gas striking the corners.

In the method for manufacturing a mask according to this aspect of the present invention, rounding a corner is preferably done as the last process in manufacturing a mask.

With this method, any corners in the silicon substrate formed in the manufacturing of the mask including the silicon substrate are rounded in the last step of the manufacturing of the mask. In other words, sharp- or right-angles in the mask including the silicon substrate are removed. Therefore, this method can easily provide a mask for forming a thin film pattern with a high degree of accuracy and whose corners are hard to break and endure repetitive use.

In the method for manufacturing a mask according to this aspect of the present invention, higher accuracy in patterning using the mask is preferably achieved by a smaller radius of the rounded corners, while higher mechanical strength of the mask is preferably achieved by a larger radius of the rounded corners.

With this method, the mask can meet the needs of high patterning accuracy by making the radius of the rounded corners small, while the mask can meet the needs of high mechanical strength (used for large-screen-display substrates or for mass production, for example) by making the radius of the rounded corners large.

In order to address the above-mentioned problems, a method for manufacturing an electro-optical device according to yet another aspect of the present invention includes forming a thin film pattern making up a layer of the electro-optical device by using the above-described mask.

According to this aspect of the present invention, it is possible to economically provide an electro-optical device that has a large screen with uniform pixel thickness distribution and provides high image quality without unevenness, for example.

In order to address the above-mentioned problems, electronic equipment according to yet another aspect of the present invention is manufactured by using the above-described mask.

According to this aspect of the present invention, for example, it is possible to economically provide electronic equipment that displays bright large images without unevenness with a widescreen. Also according to this aspect of the present invention, it is possible to economically provide electronic equipment that includes an electronic circuit etc. composed of a thin film that is highly precisely patterned entirely on a large substrate.

BRIEF DESCRIPTION OF THE DRAWINGS

FIG. 3 is a sectional view showing a modification of the embodiment of the mask according to the present invention.

FIG. 4 is a table showing the relation between the dimensions of the rounded corners R and the endurance of masks of the embodiment according to the present invention.

FIG. 5 is a flow chart showing an embodiment of a method for manufacturing a mask according to the present invention.

DETAILED DESCRIPTION

Embodiments of a mask according to the present invention will be described with reference to the accompanying drawings.

Mask Structure

Figure 1:
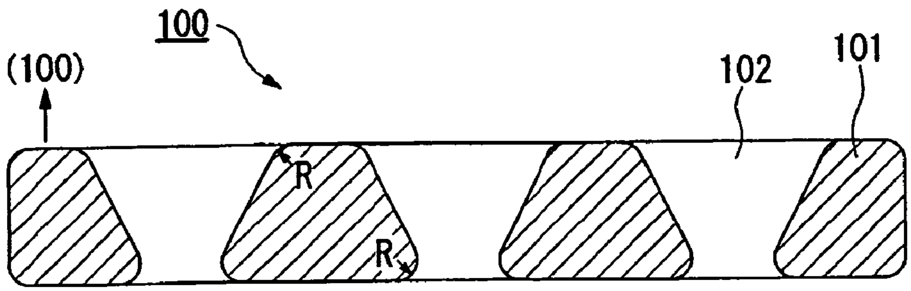
FIG. 1 is a sectional view illustrating an example of an embodiment of a mask according to the present invention.
Figure 2:
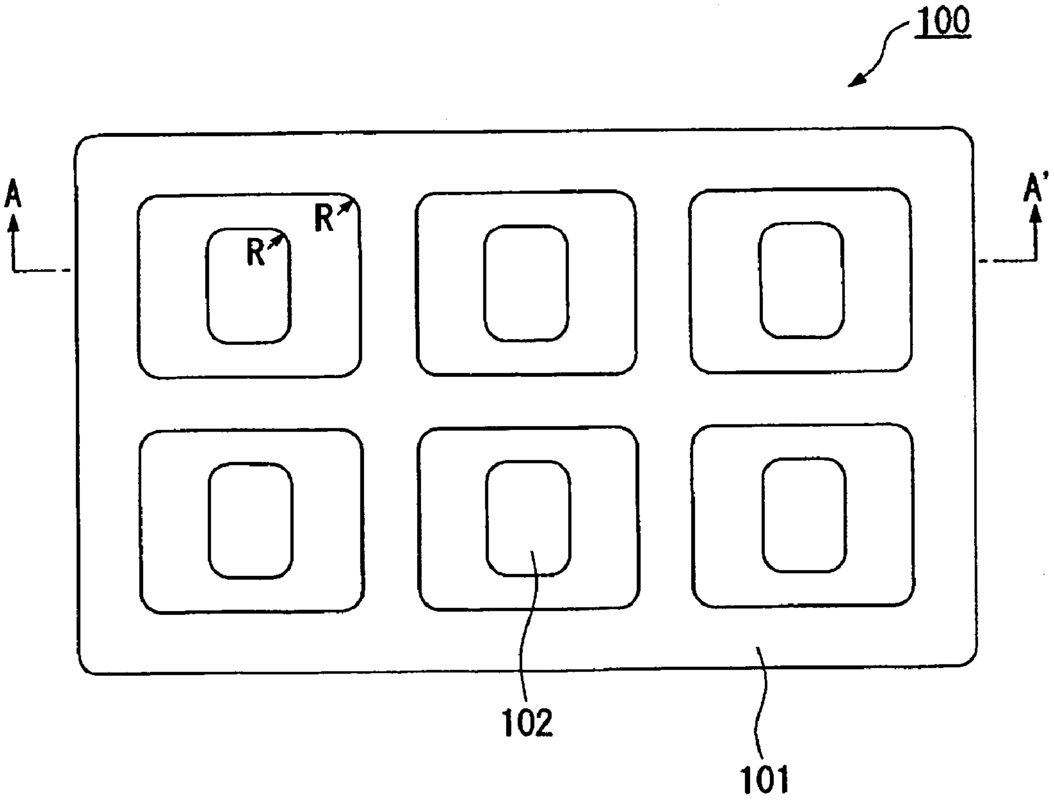
FIG. 2 is a plan view of the mask.

FIG. 1 is a sectional view illustrating an example of an embodiment of a mask according to the present invention. FIG. 2 is a plan view of the mask shown in FIG. 1. More specifically, FIG. 1 is a sectional view of a mask 100 along line A-A' shown in FIG. 2. The mask 100 of the present embodiment can be used as, for example, an evaporation mask. When using the mask 100 for patterning a thin film on a member on which the film is deposited, the mask 100 is disposed between an evaporation source and the member.

The mask 100 of the present embodiment includes a silicon substrate 101. The silicon substrate 101, for example, has surface orientation (100). The silicon substrate 101 is provided with an opening 102 that forms a through-hole. The opening 102 forms a through-hole through which a material to be evaporated from the evaporation source passes during evaporation. Therefore, the opening region of the opening 102 has a shape that is almost the same as that of a thin film to be patterned on the member (e.g. glass substrate).

The inner side of the opening 102 is tapered. It is preferable that the smaller opening side of the tapered opening 102, that is, the side opposite to the surface orientation (100) of the silicon substrate 101, is closely adhered to the member during evaporation. Accordingly, even when the evaporation source and the mask 100 move relative to the member, it is possible to reduce a portion of the mask 100 that sometimes makes a shadow on a material to be evaporated. This enables highly accurate patterning to an even thickness. Here, while there are six openings each corresponding to the opening 102 in the mask 100 shown in FIGS. 1 and 2, the present invention is not limited to this. The number, shape, and arrangement of the opening 102 can be set freely.

In the mask 100 of the present embodiment, every corner of the silicon substrate 101 is rounded (hereinafter called the "rounded corner R"). In other words, every corner of the silicon substrate 101 including that of the opening 102 is neither right-angled nor sharp-angled, and has a structure that reduces stress concentration. Here, only the opening 102 of the mask 100 may have the rounded corners R. As shown in FIGS. 1 and 2, both the cross section and planar shapes of the silicon substrate 101 may have the rounded corners R. This way, the silicon substrate 101 has no right-angled or sharp-angled corners from any 3D angle. This structure reduces the concentration of stress that can be applied to the mask 100 from any direction.

FIG. 3 is a sectional view showing a modification of the embodiment of the mask according to the present invention. A mask 200 of this modification includes a silicon substrate 201. The silicon substrate 201, for example, has surface orientation (110). The silicon substrate 201 is provided with an opening 202 that forms a through-hole. The mask 200 has the opening 202 whose inner side is shaped differently from the opening of the mask 100. The inner side of the opening 202 is not tapered, but formed almost perpendicular to the front and back surfaces of the mask 200.

The mask 200 has similar structure to that of the mask 100 in other respects. This means every corner of the-silicon 201 in the mask 200 is rounded (rounded corner R). Accordingly, every corner in the mask 200 including that of the opening 202 has a structure that reduces stress concentration.

The opening of a conventional evaporation mask including a silicon substrate is generally formed by anisotropic crystal etching. Thus the opening of the evaporation conventional mask has right-angled corners, and cannot be rounded like the rounded corner R. Therefore, stress tends to be concentrated in the corners in the conventional evaporation mask, and the mask is easily broken as a crack develops at the point of stress concentration. In addition, the opening of the conventional evaporation mask has sharp corners of 54.7 degrees in contact with a member (substrate) on which a film is deposited, and thereby harming the substrate and often resulting in defective pieces.

Since the masks 100 and 200 of the present embodiment are provided with the rounded corners R at every corner including that of the openings 102 and 202, stress on every corner including the openings 102 and 202 can be reduced, and thereby significantly reduce the possibility of damage etc.

Also, since the openings 102 and 202 in the masks 100 and 200 of the present embodiment are provided with the rounded corners R, they do not have the above-described sharp parts in contact with a member on which a film is deposited. Therefore, the masks 100 and 200 of the present embodiment can be used for mask evaporation without harming the member, which can improve yield.

The dimensions of the rounded corners R will now be described.

FIG. 4 is a table showing the relation between the dimensions of the rounded corners R and the endurance of the masks 100 and 200. FIG. 4 shows endurance test results of ten types of the masks 100 and 200 whose rounded corners R have a radius ranging from 0.01 μm to 10.0 μm. In this test, the masks were used for evaporation, and whether the masks were damaged or not was observed.

For instance, the masks 100 and 200 with the rounded corners R whose radius is 0.01 μm were broken by single mask evaporation. Meanwhile, the masks 100 and 200 with the rounded corners R whose radius is 0.5 μm were broken after 100 times of mask evaporation. This means that the masks 100 and 200 with the rounded corners R whose radius is 0.5 μm can be used for manufacturing 100 units of devices. The masks 100 and 200 with the rounded corners R whose radius is 1.0 μm or more were not broken even when they were used for 1000 times or more of mask evaporation. Accordingly, the masks 100 and 200 with the rounded corners R whose radius is 1.0 μm or more can be used for mass produced devices.

This endurance test results show that the larger radius of the rounded corners R provides the higher endurance of the masks 100 and 200, and the radius of the rounded corners R is preferably 0.5 μm or more.

However, it becomes difficult to form an evaporated pattern with sufficient accuracy as the radius of the rounded corners R increases. This is because, for example, an overhung (inverted tapered) part formed in the inner side of the openings 102 and 202 becomes larger as the radius of the rounded corners R increases, making a portion that sometimes makes a shadow on a material to be evaporated larger. Therefore, by setting the radius of the rounded corners R at 3 μm or less, it is possible to form an evaporated pattern with sufficient accuracy to some extent.

Consequently, the masks 100 and 200 of the present embodiment with the radius of the rounded corners R ranging from 0.5 μm to 3.0 μm can improve both accuracy in an evaporated pattern and the mechanical strength of the masks.

Method for Manufacturing Mask

FIG. 5 is a flow chart showing an embodiment of a method for manufacturing a mask according to the present invention. The masks 100 and 200 shown in FIGS. 1 to 3 are manufactured by this method for manufacturing a mask. The method for manufacturing a mask will now be described.

First, an opening is formed in a silicon substrate that makes up a mask in a way that the opening penetrates the silicon substrate (step S1).

As step 1, a silicon wafer having a predetermined shape is prepared, and an opening is formed in the silicon wafer by anisotropic crystal etching, for example. Here, anisotropic crystal etching can be employed for forming an opening with a high degree of dimensional accuracy, but this method makes the corners of the opening right- or sharp-angled.

Second, corners in the silicon substrate including those of the opening are rounded to be rounded corners R (step S2).

This is easily and desirably performed by isotropic etching, for example, in step S2. More specifically, the silicon substrate in which the opening has been formed is immersed in an etchant (at 25 degrees Celsius) consisting of 100 ml of 50% hydrofluoric acid (for electronics use), 2500 ml of 61% nitric acid (for electronics use), and 1000 ml of acetic acid (for electronics use) for one to three minutes. This enables step S2 to be performed desirably. The radius of the rounded corners R can be adjusted by adjusting etching time.

In this immersion step, the corners in the silicon substrate are oxidized by nitric acid (first material) and then the oxidized portion is removed by hydrofluoric acid (second material). Furthermore, a rough exposed surface of the silicon substrate is polished by acetic acid in this immersion step. Therefore, this manufacturing method can easily provide a mask that is closely adhered to a member on which a film is deposited, used for forming a thin film pattern with a high degree of accuracy, and equipped with high mechanical strength.

Also, step S2 can be performed by an isotropic etching process employing dry etching. For example, either SF6, CF or chlorinated gas is used for dry-etching the silicon substrate in this isotropic etching process. More specifically, the silicon substrate in which the opening has been formed is placed in a plasma etcher, and etched with plasma while supplying SF6 gas. This dry etching process can also adjust the radius of the rounded corners R by adjusting etching time.

The above-described step S2 for forming the rounded corners is preferably performed as the last step in manufacturing the mask. This way any corners in the silicon substrate formed in the manufacturing of the mask including the silicon substrate (e.g. in step S1 for forming an opening) are rounded in the last step of the manufacturing of the mask. In other words, any right- and sharp-angled corners in the silicon substrate can be easily rounded without fail. Therefore, the present embodiment can easily provide a mask for forming a thin film pattern with a high degree of accuracy and whose corners are hard to break and endure repetitive use.

Also, in the present embodiment of the method for manufacturing a mask, higher accuracy in patterning using the mask can be preferably achieved by a smaller radius of the rounded corners R, while higher mechanical endurance of the mask can be preferably achieved by a larger radius of the rounded corners R. By making the radius of the rounded corners small, the mask can meet the needs of high patterning accuracy. Meanwhile, by making the radius of the rounded corners large, the mask can meet the needs of high mechanical strength (used for large-screen-display substrates or for mass production, for example).

Application

Referring now to FIGS. 6 through 16, an application of the present embodiment will be described.

Figure 6:
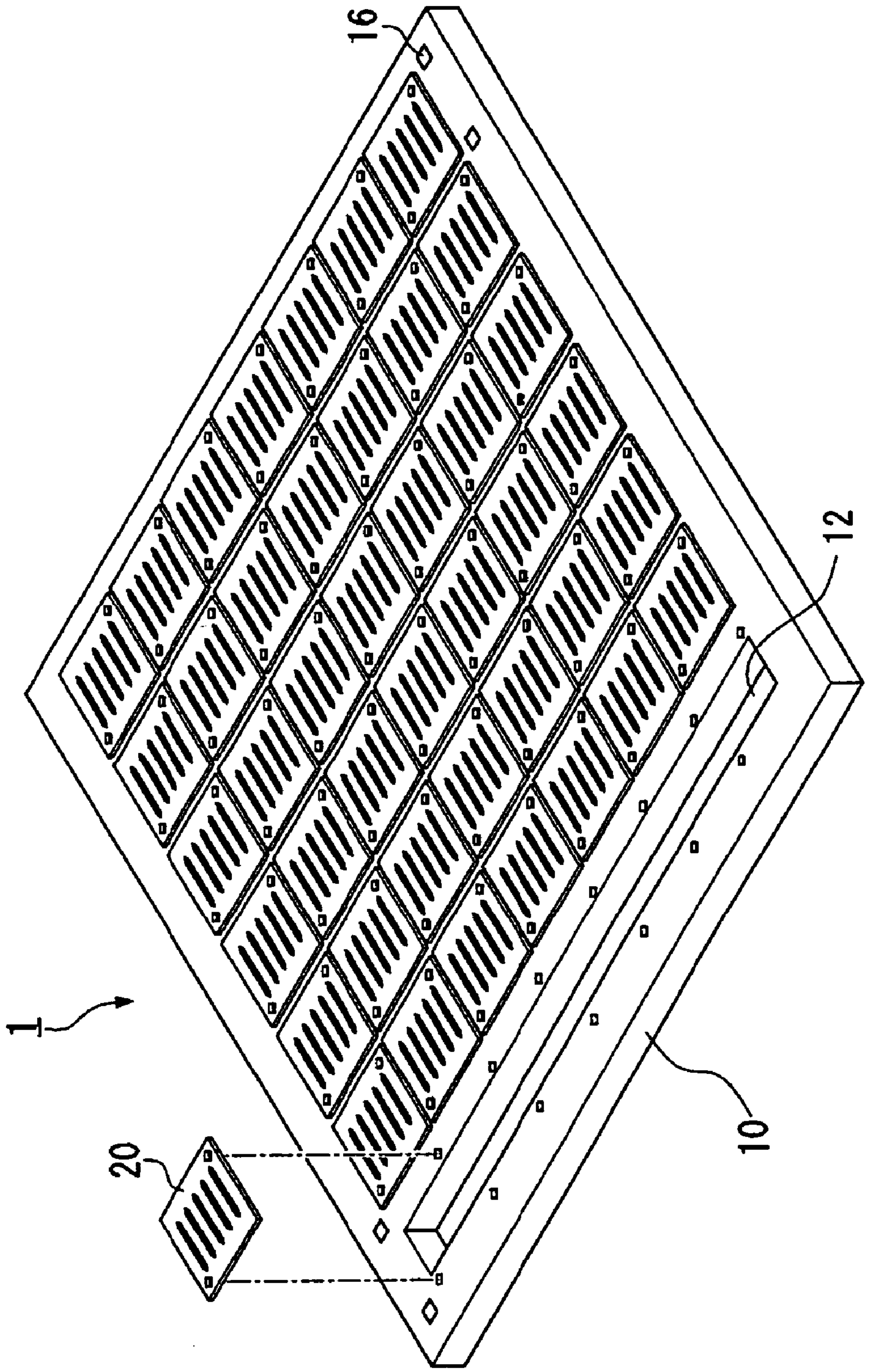
FIG. 6 is a perspective view schematically showing an application of the present embodiment of the mask according to the present invention.
Figure 7:
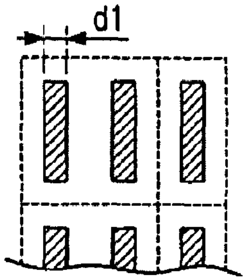
FIG. 7 is a diagram illustrating array examples of pixel patterns formed with the mask.
Figure 7:
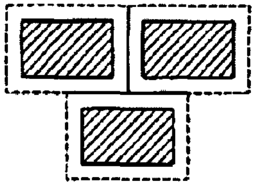
Figure 7:
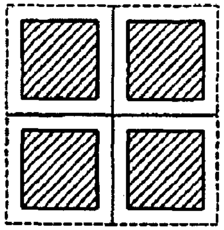
Figure 8:
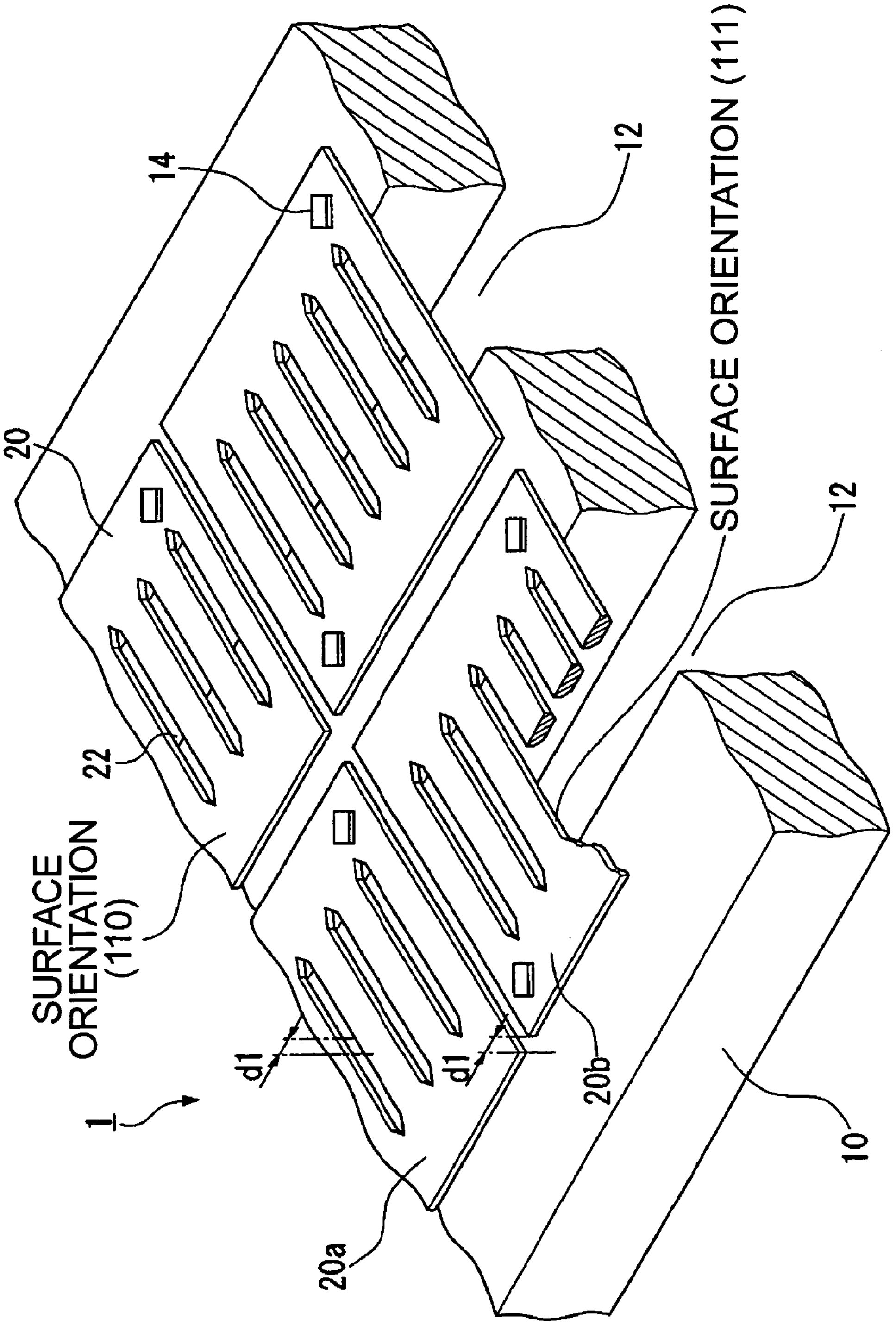
FIG. 8 is a partially enlarged perspective view of the mask.

FIG. 6 is a perspective view schematically showing an application of the present embodiment of the mask. FIG. 7 is a diagram illustrating array examples of pixel patterns formed with the mask shown in FIG. 6. FIG. 8 is a partially enlarged perspective view of the mask shown in FIG. 6. In this embodiment, the mask 1 includes the masks 100 and 200 shown in FIGS. 1 to 3. That is to say, the mask 1 includes the masks 100 and 200 as chips 20. The mask 1 of this embodiment can be used as, for example, an evaporation mask.

The mask 1 has a structure in which the plurality of chips 20 (the masks 100 and 200) are provided to a supporting substrate 10 that serves as a base substrate. Each of the chips 20 is adhesively bonded with alignment to the supporting substrate 10. A mask positioning mark 16 is provided to the supporting substrate 10. The mask positioning mark 16 is used for positioning the mask 1 when evaporation is performed with the mask 1, for example. The mask positioning mark 16 can be formed, for example, with a metal film. Meanwhile, the mask positioning mark 16 may be provided to the chip 20.

As shown in FIGS. 6 and 8, a plurality of opening regions 12 including opening parts of rectangular through-holes are disposed on the supporting substrate 10 in parallel with each other at a fixed interval. As shown in FIG. 8, a plurality of elongated openings 22 (corresponding to the openings 102 and 202) are provided to the chip 20 in parallel with each other at a fixed interval. Each of the openings 22 of the chip 20 has a shape corresponding to the thin film pattern of a vertical-stripe pixel arrangement shown in FIG. 7. Therefore, the mask 1 is used for forming pixels in the vertical stripe configuration.

The chips 20 are arranged in rows and columns on the supporting substrate 10, so that each chip 20 closes up each opening region 12 on the supporting substrate 10, and the longitudinal direction of the opening region 12 is perpendicular to the longitudinal direction of the opening 22 of the chip 20.

It is preferable that the material of the supporting substrate 10 has a thermal expansion coefficient that is equal or close to that of the material of the chip 20. Since the chip 20 is made of silicon, the supporting substrate 10 is made of a material whose thermal expansion coefficient is equal or close to that of silicon. By doing this, the occurrence of strain or bending caused by a thermal expansion difference between the supporting substrate 10 and the chip 20 can be suppressed. For example, the thermal expansion coefficient (30×10 E-7/degrees Celsius) of Pyrex (registered trademark) of Corning Incorporated is almost equal to that of silicon (30×10 E-7/degrees Celsius). The following materials also have a thermal expansion coefficient close to that of silicon: OA-10 (38×10 E-7/degrees Celsius), which is alkali-free glass, of Nippon Electric Glass; alloy 42 (50×10 E-7/degrees Celsius), which is a metal; and invar materials (12×10 E-7/degrees Celsius). Thus, Pyrex (registered trademark) glass, alkali-free glass OA-10, and alloy 42 can be used as the material of the supporting substrate 10, for example.

The chip 20 includes the opening 22 provided to a rectangular plate as shown in FIG. 8.

Since the mask 1 of the present embodiment is used for forming pixels in the vertical stripe configuration shown in FIG. 7, the opening 22 of the chip 20 has, for example, a slotted groove shape as large as approximately forty vertical pixels in a row. That is, the opening 22 of the chip 20 has a shape corresponding to at least the partial shape of a thin film pattern to be formed on a surface on which a film is deposited. The area occupied by the chip 20 is smaller than the area of the thin film pattern (e.g. a thin film pattern constructing an organic EL panel) formed with the mask 1.

The silicon that makes up the chip 20 of the present embodiment has a surface orientation (110). Alternatively, the chip 20 may be made of silicon that has a surface orientation (100). The side of the opening 22 of the chip 20 in the longitudinal direction has a surface orientation (111). The side of the opening 22 can readily have the surface orientation (111) by performing anisotropic crystal etching to the silicon chip having the surface orientation (110). Also, every corner in the silicon chip 20 including that of the opening 22 is rounded to be the rounded corner R by performing isotropic etching to the silicon chip that has been anisotropic-crystal-etched.

In each chip 20, an alignment mark 14 is provided in at least two parts.

The alignment mark 14 is used for positioning the chip 20 relative to the supporting substrate 10 when the two are bonded. The alignment mark 14 is formed by photolithography or anisotropic crystal etching, for example.

Each chip 20 is attached to the supporting substrate 10, so that the longitudinal direction of the opening 22 of the chip 20 is perpendicular to that of the opening region 12 of the supporting substrate 10. The width of the opening 22 is set, for example, to be the same as a sub-pixel-pitch d1 of a pixel. Chips 20*a*and 20*b*are disposed side by side with an interval of the sub-pixel-pitch d1 of a pixel. The chips 20*a*and 20*b*are among the chips 20 closing up the corresponding opening regions 12. The clearance between the chips 20*a* and 20*b*functions, in a similar way to the opening 22 of the chip 20, as an opening of the mask 1 for forming a thin film pattern into a desired shape. In addition, the chips 20 that are adjacent to each other are laid out with an interval in the direction perpendicular to the longitudinal direction of the opening region 12. The plurality of chips 20 are arranged at an interval in a matrix on the supporting substrate 10 as shown in FIG. 6.

In this way, a thin film pattern larger than the chip 20 can be formed, since the plurality of chips 20 are attached to the supporting substrate 10 in the mask 1 of the present embodiment. For example, pixels in the vertical stripe configuration making up a widescreen display panel can be formed. Furthermore, the mask 1 of the present embodiment is made of silicon and provided with the rounded corners R at every corner in the chip 20 including that of the opening 22, and thereby providing high endurance and avoiding damaging a member on which a film is deposited.

Figure 9:
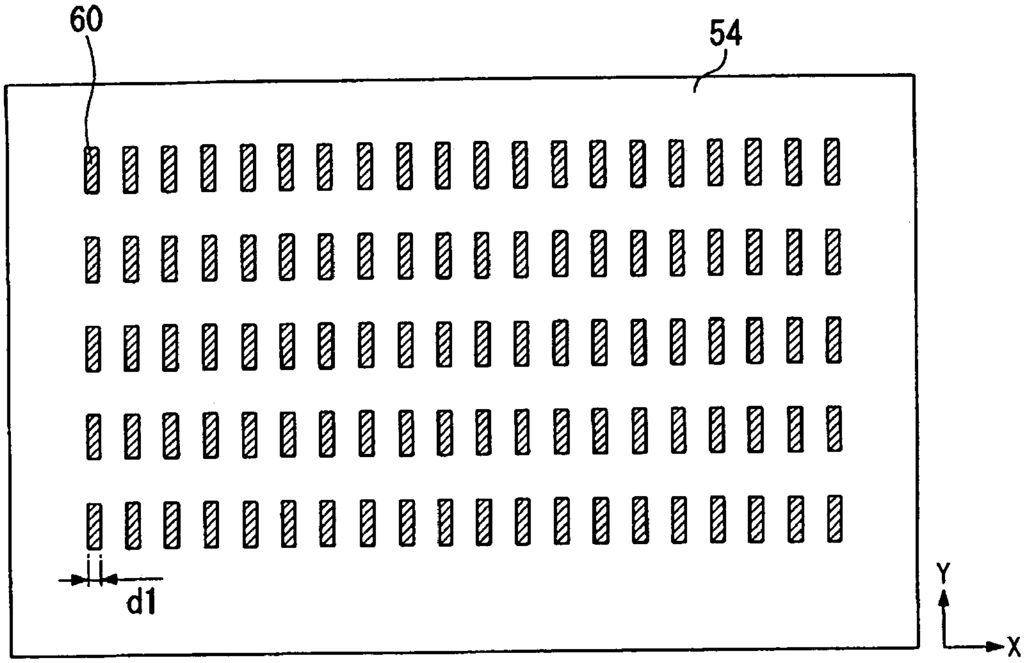
FIG. 9 is a plan view illustrating an example of an evaporated pattern formed by using the mask.
Figure 10:
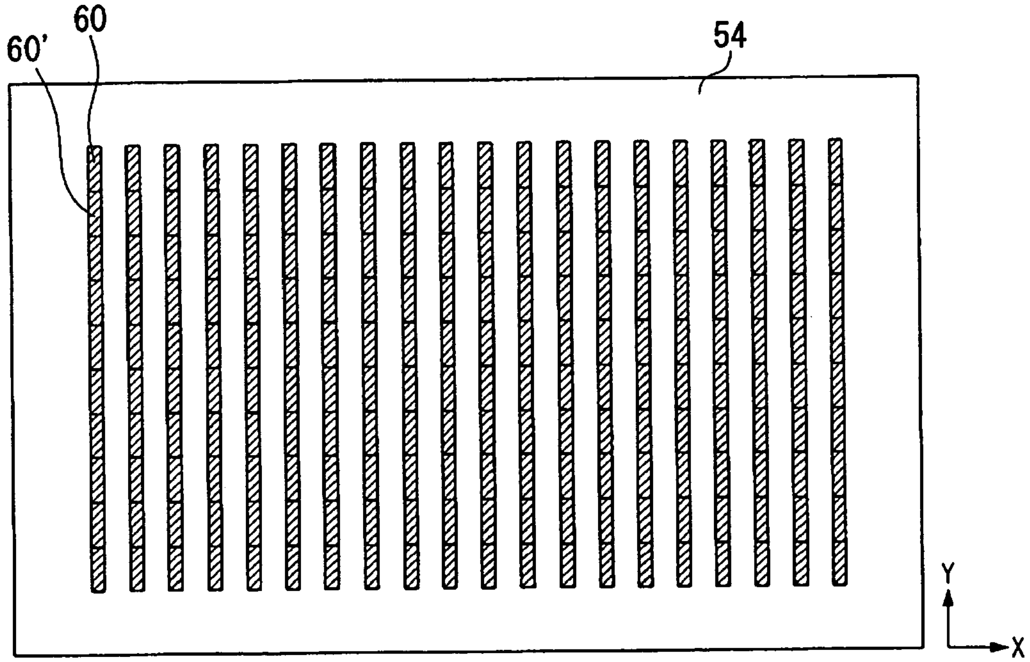
FIG. 10 is a plan view illustrating an example of an evaporated pattern formed by using the mask.
Figure 11:
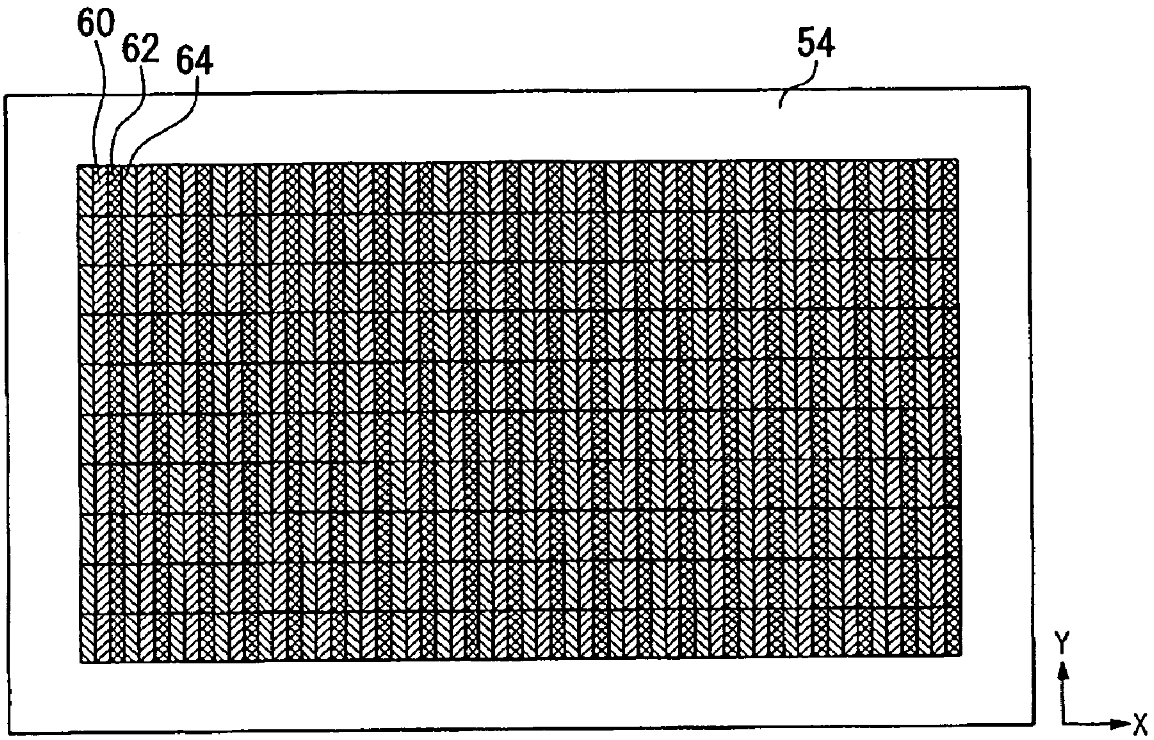
FIG. 11 is a plan view illustrating an example of an evaporated pattern formed by using the mask.

FIG. 9 is a plan view illustrating an example of an evaporated pattern (thin film pattern) formed by using the mask 1 shown in FIGS. 6 and 8. FIG. 10 is a plan view illustrating an example in which evaporation is performed again, after shifting the mask 1, to the substrate on which the evaporated pattern shown in FIG. 9 has been formed. FIG. 11 is a plan view illustrating an example in which evaporation is performed again, after re-shifting the mask 1, to the substrate on which the evaporated pattern shown in FIG. 10 has been formed.

For a substrate 54 that serves as a member on which the evaporated pattern is formed, transparent substrates such as a glass substrate that is an element of an organic EL device can be used. The evaporated pattern in this case is, for example, the stripe pattern that serves as a luminescence layer 60 or red color in an organic EL device. Thus, the width of the luminescence layer 60 is the same as the sub-pixel-pitch d1 of a pixel.

However, in the evaporated pattern shown in FIG. 9, pixels in multiple lines (40 lines×5, for instance) out of red color pixels of an organic EL device have not been formed. Therefore, evaporation is performed again after shifting the mask 1 in the vertical direction (the Y-axis direction), for example, by forty pixels with respect to the substrate 54. As a result, a luminescence layer 60' of red color is patterned as shown in FIG. 10. Accordingly, a thin film pattern can readily be formed for a widescreen panel that has a large vertical stripe pattern.

In the evaporated pattern shown in FIG. 10, only the luminescence layers 60 and 60' of red color have been formed, but luminescence layers of green or blue color have not been formed. The luminescence layer 62 of green color is formed as shown in FIG. 11 by patterning a green color luminescence material after shifting the mask 1 in the horizontal direction (the X-axis direction) by one sub-pixel-pitch with respect to the substrate 54 shown in FIG. 10. The luminescence layer 64 of blue color is also formed as shown in FIG. 11 by patterning a blue color luminescence material after shifting the mask 1 in the horizontal direction (the X-axis direction) by one sub-pixel-pitch.

Accordingly, a thin film pattern that serves as a widescreen panel that provides color display can readily be formed with a high degree of accuracy. In the present embodiment, a thin film pattern that serves as one widescreen panel is formed by performing several times of evaporation with the mask 1 shifted each time. It is also possible to form the thin film pattern that serves as one widescreen panel by alternatively using several kinds of masks each corresponding to the mask 1 prepared in advance.

FIG. 12 is a sectional view schematically showing a method for manufacturing the mask of the present embodiment. In other words, FIG. 12 illustrates a method for manufacturing the chip 20 that is made of silicon and serves as a major element of the mask 1.

Figure 12A:
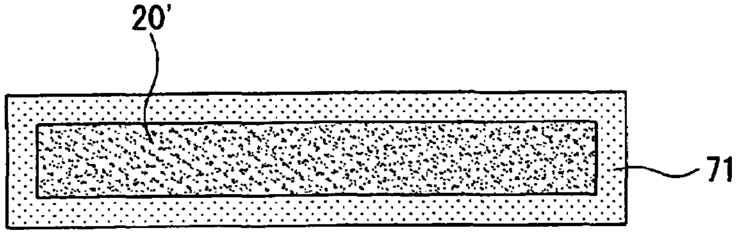
FIGS. 12A-12D are sectional views schematically showing a method for manufacturing the mask.

A silicon wafer 20' that has the surface orientation (110) is prepared. A silicon oxide film 71 that serves as an anti-etching mask material is formed entirely on an exposed surface of the silicon wafer 20' by thermal oxidization to a thickness of 1 μm as shown in FIG. 12A.

Any kind of film that has durability in the anisotropic crystal etching performed using an aqueous solution of alkali in a later process can be used as the anti-etching mask material of the silicon oxide film 71. Therefore, the anti-etching mask material is not particularly limited to a silicon oxide film. A silicon nitride film deposited by CVD or an Au (gold) or Pt (platinum) film or the like deposited by sputtering may be used instead.

Next, a groove pattern 72 is formed that corresponds to an opening shape (cross section) of the opening 22 by patterning the silicon oxide film 71 on one face of the silicon wafer 20' by photolithography. Here, the groove pattern 72 is formed so that the surface orientation (111) of silicon is at right angles to the longitudinal direction of the groove pattern 72 as shown in FIG. 12B.

The alignment mark 14 may be formed at the same time that the groove pattern 72 is formed.

Figure 12B:
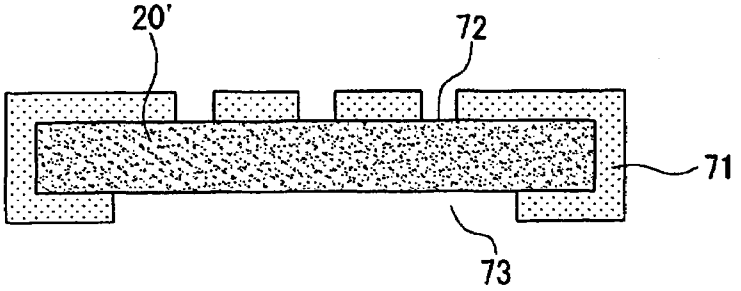

A large region 73 of the silicon oxide film 71 formed on the other face of the silicon wafer 20', including a part corresponding to the opening 22, is removed by the photolithography as shown in FIG. 12B at the same time as the groove pattern 72 is formed.

The region 73 of the silicon oxide film 71 formed on the other face of the silicon wafer 20' is thus removed in order to reduce a thickness d2 of a region including the opening 22 of the silicon wafer 20' in a later process. More specifically, in order to uniform the thickness of a deposited thin film, the chip 20 formed from the silicon wafer 20' is made thin, so that evaporated particles easily travel through the opening 22 in an oblique direction in evaporation.

For patterning the silicon oxide film 71 using photolithography, for example, a buffered hydrofluoric acid solution is used.

Figure 12C:
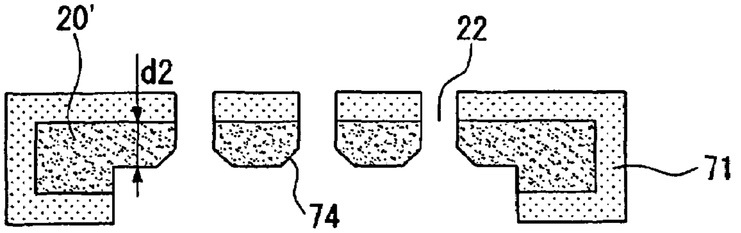

Next, anisotropic crystal etching is performed to the silicon wafer 20' shown in FIG. 12B using a 35 wt % solution of potassium hydroxide heated up to 80 degrees Celsius. By performing the anisotropic crystal etching, part of the silicon wafer 20' that is not covered by the silicon oxide film 71 is removed from both the one face and the other face. Thus, a through groove that serves as the opening 22 is formed and the thickness d2 of the region including the opening 22 is reduced. Also, by performing the anisotropic crystal etching, a corner 74 on the region 73 side of the silicon wafer 20' is etched and tapered as shown in FIG. 12C.

The tapered shape of the corner 74 and the thickness d2 of the region including the opening 22 can be controlled by controlling etching time of the anisotropic crystal etching. Consequently, a favorable mask can be manufactured in that a shadow region of the mask 1 is not changed even though the relative position of the mask 1 to an evaporation source varies.

Figure 12D:
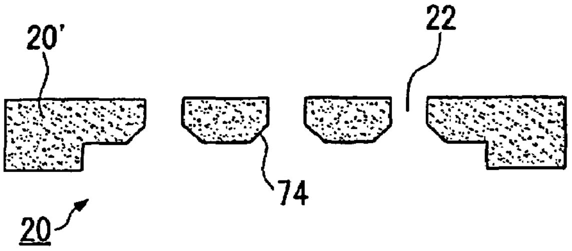

The chip 20 having the opening 22 is formed by removing the silicon oxide film 71 formed on the silicon wafer 20' as shown in FIG. 12D. For removing the silicon oxide film 71, for example, a buffered hydrofluoric acid solution is used.

The process shown in FIGS. 12A to 12D corresponds to step S1 for forming an opening with reference to FIG. 5. Therefore, the process shown in FIG. 12D is followed by the step for forming rounded corners as shown in FIG. 5, which completes the chip 20 that makes up the mask 1. More specifically, isotropic etching is performed to the chip 20 for a predetermined period of time after the process shown in FIG. 12D.

Accordingly, the manufacturing method according to the present embodiment forms the opening 22 of the chip 20 by anisotropic crystal etching, and thereby processing the shape of the opening 22 with a high degree of accuracy. The manufacturing method also provides the rounded corners R at every corner in the chip 20 by performing isotropic etching after the anisotropic crystal etching. Therefore, it is possible to easily manufacture the chip 20 that forms a thin film pattern with a high degree of accuracy and whose corners are hard to break and endure repetitive use.

Method for Manufacturing Electro-Optical Device

Figure 13:
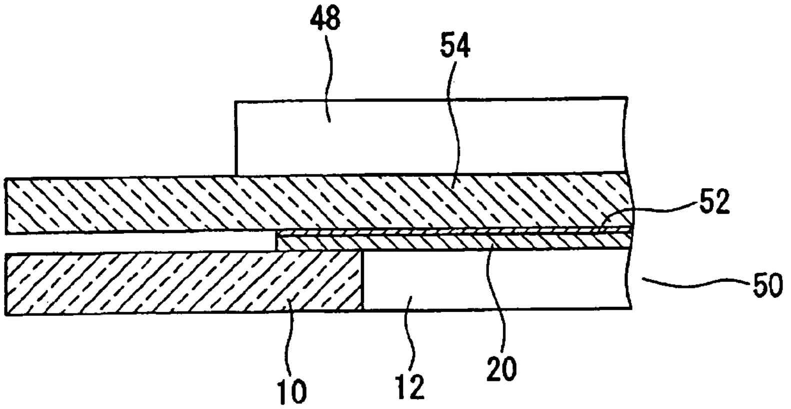
FIG. 13 is a sectional view schematically showing an embodiment of a method for manufacturing an electro-optical device according to the present invention.

FIG. 13 is a sectional view schematically showing an embodiment of a method for manufacturing an electro-optical device according to the present invention.

In the present embodiment, an organic EL device will be explained as an electro-optical device. A magnetic film 52 is formed on a mask 50, corresponding to the mask 1, as shown in FIG. 13. The magnetic film 52 can be made of a ferromagnetic material such as iron, cobalt, and nickel. Alternatively, the magnetic film 52 may be made of a magnetic metal material such as Ni, Co, Fe, or a stainless alloy containing Fe, or made by bonding a magnetic metal and nonmagnetic metal materials. Other details of the mask 50 are the same as those of the mask 1.

Figure 14A:
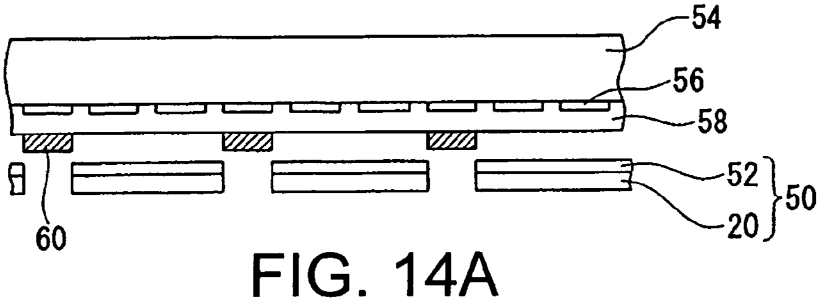
FIGS. 14A-14C are sectional views schematically showing an embodiment of a method for forming a film of a luminescence material according to the present invention.

In the present embodiment, a luminescence material is deposited on a substrate 54 (member on which a film is deposited) by using the mask 50. The substrate 54 is used for forming a plurality of organic EL devices and is a transparent substrate, such as a glass substrate. As shown in FIG. 14A, an electrode 56 (e.g. a transparent electrode made of ITO) and a hole transport layer 58 are provided to the substrate 54. Here, an electron transport layer may also be formed.

As shown in FIG. 13, the mask 50 is placed so that the chip 20 is located at the substrate 54 side. A magnet 48 disposed at the back of the substrate 54 attracts the magnetic film 52 formed on the mask 50 (the chip 20).

Figure 14B:
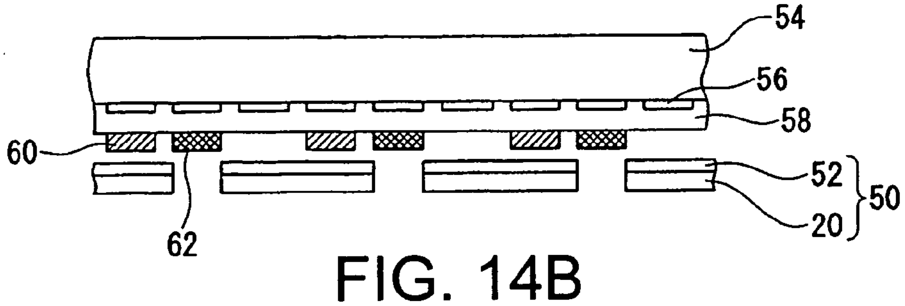
Figure 14C:
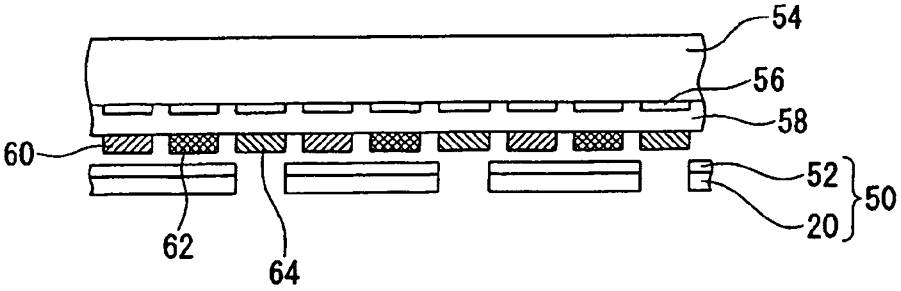

FIGS. 14A to 14C are schematic sectional views explaining a method for forming a film of a luminescence material used for manufacturing an organic EL device. Examples of the luminescence material may include organic materials, including low-molecular organic materials such as quinolinol-aluminum complex ($Alq_3$), and organic polymer materials such as poly(para-phenylenevinylene) (PPV). A film of a luminescence material can be deposited by evaporation.

For example, as shown in FIG. 14A, the red luminescence layer 60 is formed by depositing and patterning a red color material through the mask 50. Then, as shown in FIG. 14B, the green luminescence layer 62 is formed by depositing and patterning a green color material after shifting the mask 50. Then, as shown in FIG. 14C, the blue luminescence layer 64 is formed by depositing and patterning a blue color material after re-shifting the mask 50.

In the present embodiment, the chip 20 that serves as a screen is partially adhesively bonded on the supporting substrate 10. Therefore, the chip 20 is with a high degree of versatility hard to warp and bend, and thus has high mechanical strength, high repeatability in selective evaporation, and high productivity. In the mask 50 of the present embodiment, the plurality of opening regions 12 are formed in the supporting substrate 10. The chip 20 is positioned corresponding to each of the opening regions 12. The plurality of chips 20 make up one organic EL device. Therefore, a widescreen organic EL device can be manufactured highly accurately and economically by using the mask 50.

Figure 15:
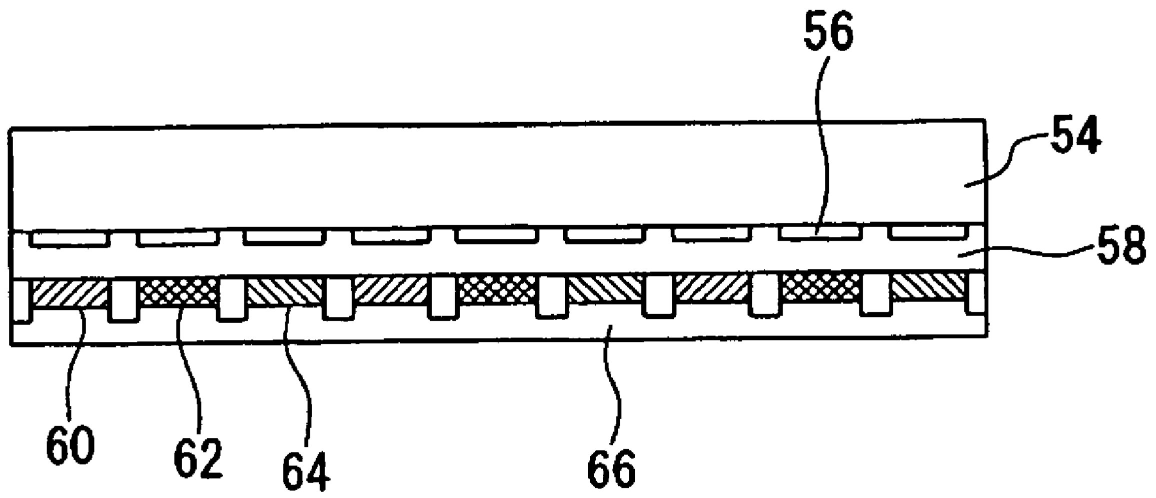
FIG. 15 is a sectional view schematically showing an organic EL device manufactured by the manufacturing method.

FIG. 15 is a sectional view schematic showing an organic EL device manufactured by the above-mentioned method for forming a film of a luminescence material. The organic EL device includes the substrate 54, the electrode 56, the hole transport layer 58, the luminescence layers 60, 62, 64, and so on. An electrode 66 is formed on the luminescence layers 60, 62, 64. The electrode 66 is, for example, a cathode electrode. The organic EL device of the present embodiment is preferably applicable to a display. In the luminescence layers 60, 62, 64, few patterns are shifted and a thickness distribution is significantly uniform, thereby economically providing a bright widescreen display without unevenness.

Electronic Equipment

Next, electronic equipment manufactured by using the mask of the above-described embodiment will be explained.

Figure 16A:
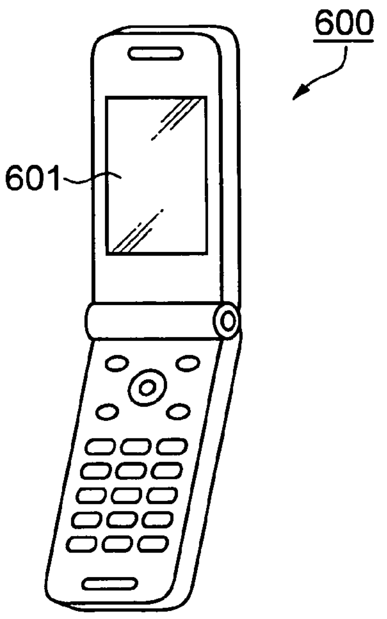
FIGS. 16A to 16C are perspective views showing embodiments of electronic equipment according to the present invention.
Figure 16B:
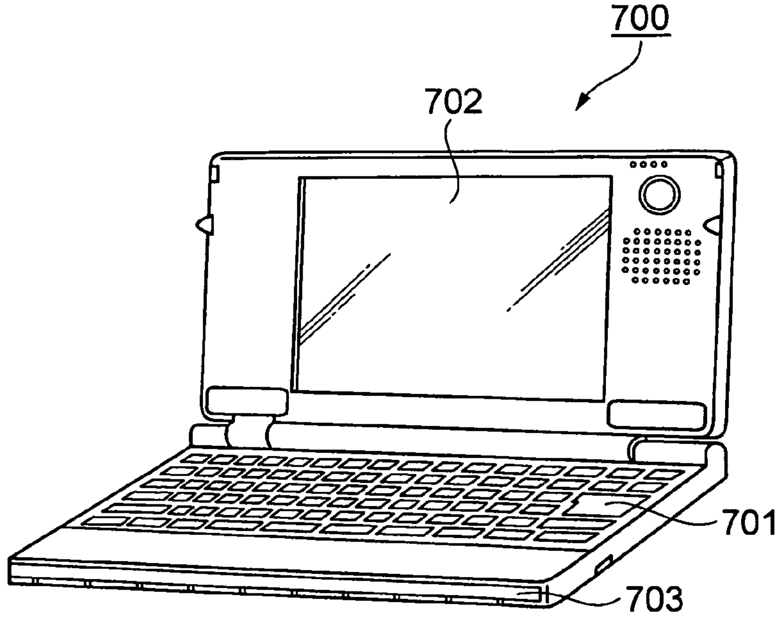
Figure 16C:
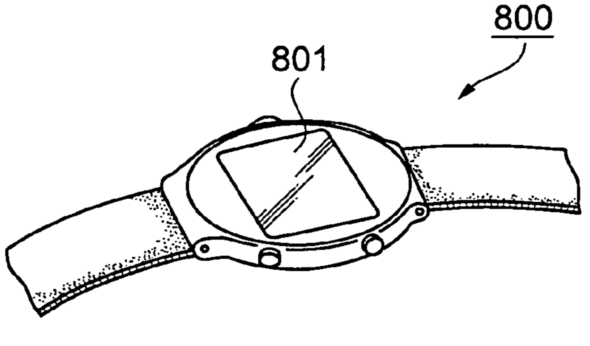

FIG. 16A is a perspective view showing an example of cellular phones. Referring to FIG. 16A, a body 600 of the cellular phone includes a display 601 including an electro-optical device formed by using the mask of the above-described embodiment. FIG. 16B is a perspective view showing an example of portable information processing devices such as a word processor and personal computer. Referring to FIG. 16B, an information processing device 700 includes an input unit 701 such as a keyboard, a display 702 including an electro-optical device formed by using the mask of the above-described embodiment, and an information processing device body 703. FIG. 16C is a perspective view showing an example of wristwatch-type electronic equipment. Referring to FIG. 16C, a body 800 of the wristwatch includes a display 801 including an electro-optical device formed by using the mask of the above-described embodiment.

The electronic equipment shown in FIG. 16 can display bright and high quality large images without unevenness and further be manufactured at low cost.

The technical scope of the present invention is not limited to the above embodiments, and various modifications can be applied without departing from the spirit and scope of the invention. The particular materials and layer structures are shown in the embodiments by way of example only, and modifications can be appropriately made thereto. For example, while the masks 1, 100, 200 are used as evaporation masks in the above-described embodiments, the present invention is not limited to this. The masks 1, 100, 200 can also be used as masks for sputtering, CVD, or the like.

What is claimed is:

1. A method for manufacturing a mask, comprising:

forming an opening penetrating through a silicon substrate of the mask; and rounding every corner of the opening.

2. The method for manufacturing a mask according to claim 1, wherein the step of rounding the corner is done by performing isotropic etching to the silicon substrate.

3. The method for manufacturing a mask according to claim 2, wherein the isotropic etching is performed by using a substance containing a first material for oxidizing a silicon crystal and a second material for removing a portion oxidized by the first material from the silicon crystal.

4. The method for manufacturing a mask according to claim 2, wherein the isotropic etching is performed by using an etchant containing nitric acid and hydrofluoric acid.

5. The method for manufacturing a mask according to claim 2, wherein the isotropic etching is performed by using an etchant containing nitric acid, hydrofluoric acid, and acetic acid.

6. The method for manufacturing a mask according to claim 2, wherein the isotropic etching is performed by dry etching.

7. The method for manufacturing a mask according to claim 6, wherein the dry etching is performed by using any of an SF6, CF, and chlorinated gas.

8. The method for manufacturing a mask according to claim 1, wherein the step of rounding the corner is done as a last step in a process of manufacturing a mask.

9. A method for manufacturing an electro-optical device, comprising:

forming a thin film pattern making up a layer of the electro-optical device by using the mask manufactured by the method of manufacturing a mask according to claim 1.

10. Electronic equipment manufactured by using the mask manufactured by the method of manufacturing a mask according to claim 1.

* * * * *